United States Patent
Lee et al.

(10) Patent No.: US 9,070,740 B2
(45) Date of Patent: Jun. 30, 2015

(54) MEMORY UNIT, MEMORY UNIT ARRAY AND METHOD OF MANUFACTURING THE SAME

(71) Applicant: INOTERA MEMORIES, INC., Taoyuan County (TW)

(72) Inventors: Tzung-Han Lee, Taipei (TW); Yaw-Wen Hu, Taoyuan County (TW); Chung-Yuan Lee, Taoyuan County (TW); Hsu Chiang, New Taipei (TW); Sheng-Hsiung Wu, Taipei (TW); Hung Chang Liao, Taipei (TW)

(73) Assignee: Inotera Memories, Inc., Taoyuan County (TW)

(*) Notice: Subject to any disclaimer, the term of this patent is extended or adjusted under 35 U.S.C. 154(b) by 27 days.

(21) Appl. No.: 13/921,260

(22) Filed: Jun. 19, 2013

(65) Prior Publication Data
US 2014/0291729 A1 Oct. 2, 2014

(30) Foreign Application Priority Data
Mar. 27, 2013 (TW) .............................. 102110965 A

(51) Int. Cl.
*H01L 27/118* (2006.01)
*H01L 21/76* (2006.01)
*H01L 27/108* (2006.01)

(52) U.S. Cl.
CPC .......... *H01L 21/76* (2013.01); *H01L 27/10823* (2013.01); *H01L 27/10876* (2013.01); *H01L 27/10891* (2013.01)

(58) Field of Classification Search
CPC ................... H01L 27/10841; H01L 27/10864
USPC .................................................. 257/302, 68
See application file for complete search history.

(56) References Cited

U.S. PATENT DOCUMENTS

| | | | | |
|---|---|---|---|---|
| 4,890,145 A | * | 12/1989 | Malhi | ........................ 257/302 |
| 5,208,657 A | * | 5/1993 | Chatterjee et al. | ............ 257/302 |
| 2004/0224476 A1 | * | 11/2004 | Yamada et al. | ............... 438/400 |

* cited by examiner

*Primary Examiner* — Fernando L Toledo
*Assistant Examiner* — Neil Prasad
(74) *Attorney, Agent, or Firm* — Rosenberg, Klein & Lee

(57) ABSTRACT

A memory unit includes a substrate, at least one charge storage element, at least one first recessed access element, and an isolation portion. The substrate has a surface and the first recessed access element is disposed in an active area of the substrate and extending from the surface into the substrate. The first recessed access element is electrically connected to the charge storage element and induces in the substrate a first depletion region. The isolation portion is adjacent to the active area and extending from the surface into the substrate. The isolation portion includes a trenched isolating barrier and a second recessed access element. The second recessed access element is disposed in the trenched isolating barrier and induces in the substrate a second depletion region merging with the first depletion region.

10 Claims, 2 Drawing Sheets

MEMORY UNIT, MEMORY UNIT ARRAY AND METHOD OF MANUFACTURING THE SAME

BACKGROUND

1. Field of the Invention

The instant disclosure relates to a semiconductor device and method of manufacturing the same; in particular, to a memory unit array and method of manufacturing the same.

2. Description of Related Art

The dynamic random access memory (DRAM) is one of the common the semiconductor memory devices. Dynamic random access memory is a data storage device for storing data as capacitor charges. Each memory unit cell can have a storage capacitor and a transistor, and the charges can be transferred therebetween. Each memory cell can utilize a word line for addressing and can utilize a bit line for accessing the data. Word line is used to control the transistor, thereby the storage capacitor can be coupled or decoupled to the bit line for complete data-writing and data-reading of the memory unit cell. A plurality of word lines are respectively corresponding to a plurality of the memory unit cells, and a plurality of bit lines are respectively correspond to a plurality of the memory unit cells.

Dynamic random access memory manufacturing is a highly competitive business, reducing the size of the individual unit and increasing the density of memory cells may allow more memory cells on a single memory chip. When the size of the memory is reduced, the isolation of each unit cell in the memory is therefore becoming more important to place the active areas closer to each other.

SUMMARY OF THE INVENTION

The object of the instant disclosure is to provide a memory unit, a memory unit array and a method of manufacturing memory unit array. The memory unit, the memory unit array and the method of manufacturing thereof utilize a second recessed access element to provide both an electrical barrier and a physical barrier between the adjacent active areas.

According to one exemplary embodiment of the instant disclosure, a memory unit is provided, which includes a substrate, at least one charge storage element, at least one first recessed access element, and an isolation portion. The substrate has a surface, and the first recessed access element is disposed in an active area of the substrate and extends from the surface into the substrate. The first recessed access element is electrically connected to the charge storage element and induces in the substrate a first depletion region. The isolation portion is adjacent to the active area and extends from the surface into the substrate. The isolation portion includes a trenched isolating barrier and a second recessed access element. The second recessed access element is disposed in the trenched isolating barrier and induces in the substrate a second depletion region merging with the first depletion region.

According to one exemplary embodiment of the instant disclosure, a memory unit array is provided, which includes a plurality of word lines, a plurality of bit lines, a plurality of memory units, and a plurality of isolation portions. The memory units are formed in a substrate and arranged into a plurality of rows and a plurality of columns. The memory units are respectively disposed in a plurality of active areas of the substrate, and each memory unit includes at least one first recessed access element and at least one charge storage element. Each first recessed access element extends into the substrate for connecting one of the memory units to one of the word lines. The charge storage element are respectively electrically connected to the first recessed access elements, thereby each charge storage element is electrically connected to one of the bit lines through the first recessed access element. The isolation portions extend into the substrate and adjacent to the active areas. Each isolation portion includes a trenched isolating barrier and a second recessed access element. The second recessed access element is disposed in the trenched isolating barrier.

According to one exemplary embodiment of the instant disclosure, a method of manufacturing the memory unit array is provided, which includes the steps of: firstly, forming a plurality of memory units in a substrate, and the memory units, each of which includes a first recessed access element and a charge storage element, are respectively disposed in a plurality of active areas of the substrate; then, forming a plurality of isolation portions in the substrate for isolating the memory units, and the isolation portions, each of which includes a trenched isolating barrier and a second recessed access element disposed in the trenched isolating barrier, extend into the substrate.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
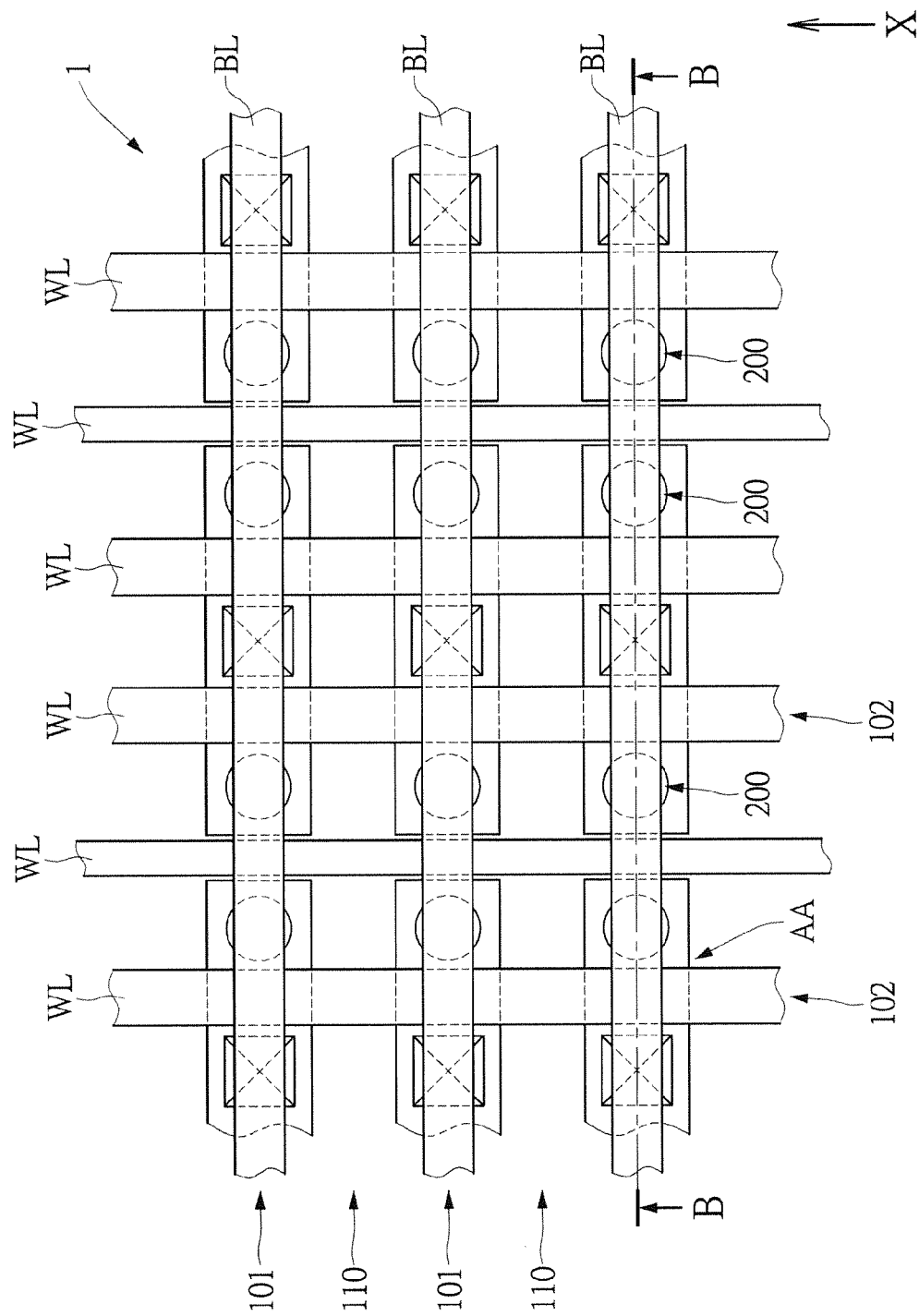
FIG. 1 illustrates a plane view of a memory unit array in accordance with an embodiment of the instant disclosure.
Figure 2:
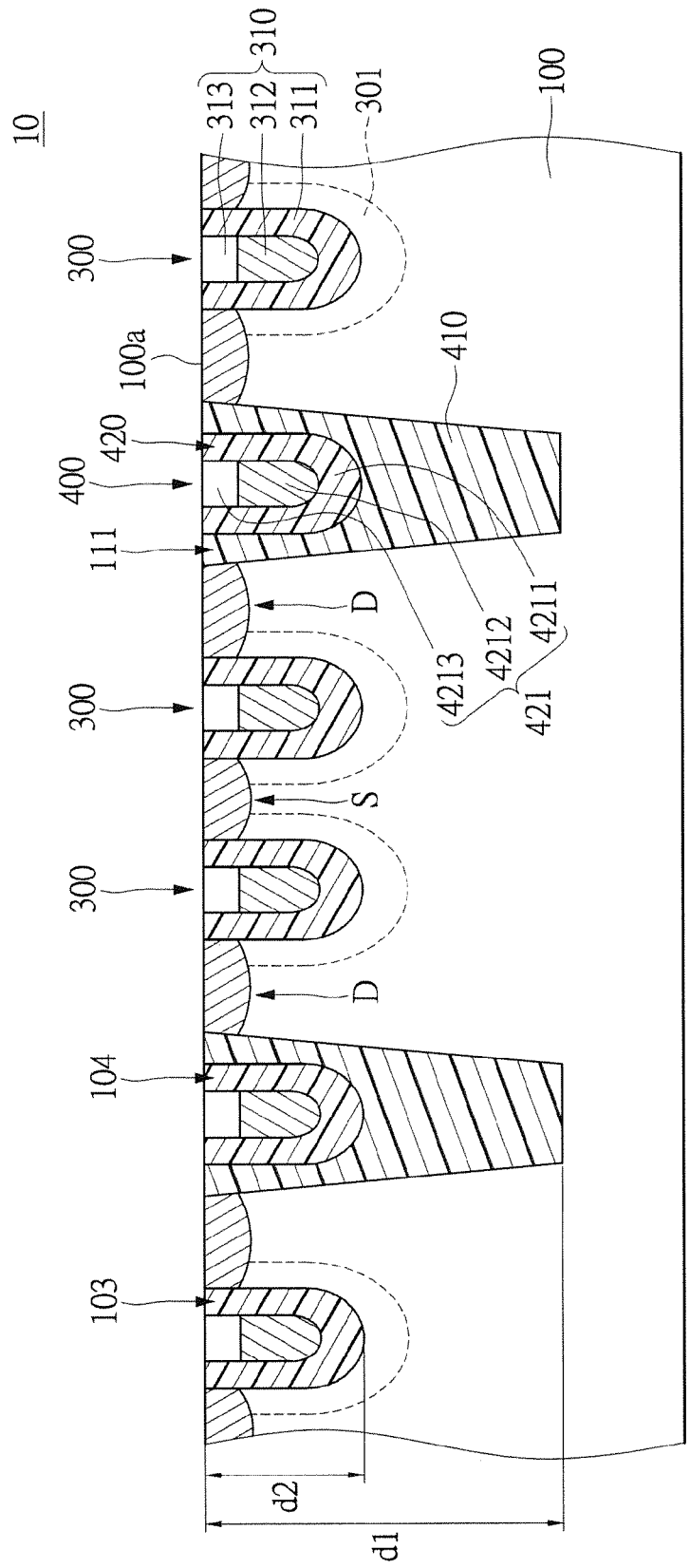
FIG. 2 is a cross-sectional partial view of a memory unit array taken along a line B-B in accordance with FIG. 1.

Please refer to FIGS. 1 to 2. FIG. 1 illustrates a plane view of a memory unit array in accordance with an embodiment of the instant disclosure, and FIG. 2 is a cross-sectional partial view of a memory unit array taken along a line B-B in accordance with FIG. 1. The memory unit array 1 includes a plurality of memory units 10, a plurality of word lines WL, a plurality of bit lines BL, and a plurality of isolation portions 400.

The memory units 10 are formed in a substrate 100 and arranged into a plurality of rows 101 and a plurality of columns 102. To put it concretely, the memory units 10 are respectively disposed in a plurality of active areas AA of the substrate 100. The substrate 100 may include semiconductor structure having a semiconductor surface, and the substrate 100 may include, for example, undoped or doped silicon wafer. In the instant disclosure, the substrate 100 may include a P-type doping silicon substrate. The substrate may includes a memory array region and a peripheral circuit area, in order to simplify the explanation, the description hereinafter exemplarily illustrates the details in the memory array region only for the purpose of further explaining the scope of the instant disclosure. As shown in FIG. 1, the substrate 100 includes a plurality of the active areas AA, and the active areas AA are arranged into a plurality of the rows 101 and a plurality of the columns 102 at predetermined pitches. In addition, a plurality of shallow trenched isolation structures 110 can be formed in the substrate 100 to isolate the immediately adjacent rows 101.

Specifically, each shallow trenched isolation structure 110 has a groove 111 extending into the substrate 100, and the groove 111 may be formed by etching process. Subsequently, one or more layers of materials may further fill within the groove 111 to form the shallow trench isolation structure 110 thereby providing a physical barrier between the immediately adjacent active areas AA. In the instant exemplarily embodiment, each shallow trenched isolation structure 110 has the groove 111 extending into the substrate, an oxide liner, a silicon nitride liner, a dielectric layer, and a high density plasma layer. The oxide liner is disposed onto the inner wall of the groove 111, and the silicon nitride liner as an etching barrier layer is disposed onto the oxide liner. The dielectric layer is disposed onto the silicon nitride liner, and the dielectric layer can be a spin-on dielectric layer having excellent gap filling capability. The high density plasma layer is disposed onto the dielectric layer, and a nitride layer may be disposed on the high density plasma layer.

It is worth mentioned that in the instant embodiment, a plurality of shallow trenched isolation structures 110 can be formed in the substrate 100 to isolate the immediately adjacent columns 102. In other words, along the X direction shown in FIG. 1, the groove 111 may be formed between the immediately adjacent active areas AA in the substrate 100. Each active area AA can be surrounded by the shallow trenched isolation structures 110. In the instant disclosure, the active area AA measures 5 to 8 F in length and measures 0.6 to 1.2 F in width. The immediately adjacent active areas AA are separated by a lengthwise interval ranging from 0.5 to 1.2 F. The memory units 10 are respectively disposed in the active areas AA of the substrate 100, whereby being arranged into a plurality of the rows 101 and a plurality of the columns 102.

As shown in FIG. 1, the word line WL and the bit line BL are perpendicular to each other, and each active area AA has two of the word lines WL passing therethrough as to form two memory cells in each active area AA. A contact plug electrically connected to the bit line BL can be disposed between the memory cells of each active area AA. It is worth to note that the interval between the immediately adjacent active areas AA may have one of the word lines WL passing therethrough.

The memory unit 10 includes a charge storage element 200 and a first recessed access element 300. The first recessed access element 300 extends from a surface 100a of the substrate 100 into the substrate 100 for connecting one of the memory units 10 to one of the word lines WL. The charge storage element 200 is electrically connected to the first recessed access element 300, and the charge storage element 200 is electrically connected to one of the bit lines BL through the first recessed access element 300. In the exemplary embodiment, the charge storage element 200 is a capacitor structure and the first recessed access element 300 is a recessed access transistor. In the instant disclosure, the memory unit 10 in each active area AA can include two capacitors and two recessed access transistors.

The first recessed access element 300 has a first recessed gate structure 310 disposed in a first gate recess 103 of the substrate 100. A first gate dielectric layer 311 is disposed onto the inner wall of the first gate recess 103, a first gate conductive layer 312 is disposed on the first gate dielectric layer 311, and a first insulating cap layer 313 is disposed on the first gate conductive layer 312. Two diffusion region in the active area AA are respectively disposed at both sides of the first recessed gate structure 310 for forming a source S and a drain D. The source S, the drain D, and the first recessed gate structure 310 form the first recessed access element 300. The first recessed gate structure 310 is electrically connected to one of the word lines WL, and the source S of the first recessed access element 300 is electrically connected to one of the bit lines BL. It is worth mentioned that the first recessed access element 300 can induce in the substrate 100 a first depletion region 301, and the first recessed access element 300 may define a current path in the substrate 100 surrounding the first gate recess 103.

One end of the charge storage element 200 may be electrically connected to a reference voltage, and the voltage level of said reference voltage is typically half of the internal operating voltage of the memory circuit. Another end of the charge storage element 200 may be electrically connected to the drain D of the first recessed access element 300. In the instant disclosure, the first gate dielectric layer 311 may contain an oxide such as silicon dioxide, and the first gate conductive layer 312 may contain a metal such as copper, gold, aluminum or contain a metal silicide such as tungsten silicide, titanium silicide, cobalt silicide or tungsten silicide. The first insulating cap layer 313 may contain an electrically insulating material such as silicon dioxide or silicon nitride.

The isolation portions 400 are formed in the substrate 100 and extend into the substrate 100, and the isolation portions 400 are adjacent to the active areas AA. Each isolation portion 400 includes a trenched isolating barrier 410 and a second recessed access element 420, which is disposed in the trenched isolating barrier 410. As mentioned, a plurality of the shallow trenched isolation structures 110 can be formed in the substrate 100 to isolate the immediately adjacent columns 102. Subsequently, the isolation portions 400 can respectively be formed in the shallow trenched isolation structures 110 that formed between the immediately adjacent columns 102. Specifically, the trenched isolating barrier 410 can be formed by etching the shallow trenched isolation structure 110, then the second recessed access element 420 can be formed in said etched shallow trenched isolation structure. It is worth mentioned that in the instant disclosure, the depth d1 of the isolation portion 400 is greater than the depth d2 of the first recessed access element 300.

In the exemplary embodiment, the second recessed access element 420 can be a recessed access transistor, and the second recessed access element 420 has a second recessed gate structure 421 disposed in a second gate recess 104 of the substrate 100. A second gate dielectric layer 4211 is disposed onto the inner wall of the second gate recess 104, a second gate conductive layer 4212 is disposed on the second gate dielectric layer 4211, and a second insulating cap layer 4213 is disposed on the second gate conductive layer 4212. The second recessed gate structure 421 is electrically connected to one of the word lines WL which is passing through the interval between the immediately adjacent active areas AA. In the instant disclosure, the second gate dielectric layer 4211 may contain an oxide such as silicon dioxide, and the second gate conductive layer 4212 may contain a metal such as copper, gold, aluminum or contain a metal silicide such as tungsten silicide, titanium silicide, cobalt silicide or tungsten silicide. The second insulating cap layer 4213 may contain an electrically insulating material such as silicon dioxide or silicon nitride.

The second recessed access element 420 can induce in the substrate 100 a second depletion region, whereby the second depletion region induced by the isolation portion 400 can be merging with the first depletion region 301 induced by the memory unit 10. Therefore, the second recessed access element 420 of the isolation portion 400 can provide an electrical barrier between the adjacent active areas AA. In addition, the trenched isolating barrier 410 of the isolation portion 400 can provide a physical barrier between the adjacent active areas AA.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A memory unit comprising:
a substrate having a surface;
at least one charge storage element;
at least one first recessed access element disposed in an active area of the substrate and extending from the surface into the substrate, wherein the first recessed access element is a recessed access transistor, the first recessed access element is electrically connected to the charge storage element and, the first recessed access element is for inducing in the substrate a first depletion region; and
an isolation portion adjacent to the active area and extending from the surface into the substrate, wherein the isolation portion includes a trenched isolating barrier and a second recessed access element, wherein the second recessed access element is disposed in the trenched isolating barrier for inducing in the substrate a second depletion region, and the trenched isolating barrier provides electrical insulation between the second recessed access element and the charge storage unit.

2. The memory unit according to claim 1, wherein the charge storage element is a capacitor structure and the first recessed access element has a first recessed gate structure extending from the surface of the substrate into the substrate, the substrate in the active area has a first diffusion region and a second diffusion region respectively disposed at two sides of the first recessed gate structure, the first recessed access element is electrically connected to the charge storage element through the first diffusion region, and the trenched isolating barrier provides electrical insulation between the second recessed access element and the first diffusion region.

3. The memory unit according to claim 1, wherein the second recessed access element has a second recessed gate structure disposed in a second gate recess in the trenched isolating barrier, and the second recessed gate structure includes a second dielectric layer disposed on the inner wall of the second gate recess and a second gate conductive layer disposed on the second gate dielectric layer.

4. The memory unit according to claim 1, wherein the depth of the isolation portion is greater than the depth of the first recessed access element.

5. A memory unit array comprising:
a substrate having a plurality of active areas;
a plurality of first word lines and second word lines, wherein the first word lines correspondingly pass through the active areas, and the second word lines correspondingly pass through the intervals between the immediately adjacent active areas;
a plurality of bit lines;
a plurality of memory units formed in the substrate, and arranged into a plurality of rows and a plurality of columns, wherein the memory units are respectively disposed in the active areas of the substrate and each memory unit includes
at least one first recessed access element extending into the substrate for connecting one of the memory units to one of the corresponding first word line, wherein the first recessed access element has a recessed access transistor having a first recessed gate structure extending into the substrate and electrically connected to the corresponding first word line; and
at least one charge storage element electrically connected to the first recessed access element, wherein the charge storage element is electrically connected to one of the bit lines through the first recessed access element; and
a plurality of isolation portions extending into the substrate and correspondingly adjacent to the active areas, wherein each isolation portion includes a trenched isolating barrier and a second recessed access element, wherein the second recessed access element is disposed in the trenched isolating barrier, the trenched isolating barrier provides electrical insulation between the second recessed access element and the corresponding charge storage unit, and the second recessed access element is electrically connected to the corresponding second word line.

6. A method of manufacturing memory unit array comprising:
forming a plurality of memory units in a substrate, the memory units being respectively disposed in a plurality of active areas of the substrate, wherein each memory unit includes a first recessed access element and a charge storage element electrically connected to the first recessed access element, wherein the first recessed access element is a recessed access transistor having a first recessed gate structure extending into the substrate; and
forming a plurality of isolation portions in the substrate correspondingly adjacent to the memory units for isolating the memory units,
wherein each of the isolation portions extends into the substrate and each of the isolation portions includes a trenched isolating barrier and a second recessed access element, wherein the second recessed access element is disposed in the trenched isolating barrier, and the trenched isolating barrier provides electrical insulation between the second recessed access element and the charge storage element of the correspondingly memory unit.

7. The method of manufacturing memory unit array according to claim 6, wherein in the step of forming the isolation portions includes: forming a shallow trenched isolation structure between the immediately adjacent active areas.

8. The method of manufacturing memory unit array according to claim 7, wherein in the step of forming the isolation portions includes:
in each of the shallow trenched isolation structures,
etching the shallow trenched isolation structure to form a second gate recess in the shallow trenched isolation structure; and
forming a second recessed gate structure in the second gate recess, wherein the second recessed gate structure includes a second gate electric layer disposed on the inner wall of the second gate recess and a second gate conductive layer on the second gate dielectric layer.

9. The method of manufacturing memory unit array according to claim 8, further comprising:
forming a plurality of first word lines and second word lines, wherein the first word lines correspondingly pass through the active areas, the second word lines correspondingly pass through the intervals between the immediately adjacent active areas, each of the first recessed gate structures is electrically connected to the corresponding first word line, and each of the second recessed gate structures is electrically connected to the corresponding second word line.

10. The method of manufacturing memory unit array according to claim 6, wherein the depth of the isolation portion is greater than the depth of the first recessed access element.

* * * * *